(12) United States Patent
Yamaguchi et al.

(10) Patent No.: US 8,084,343 B2
(45) Date of Patent: *Dec. 27, 2011

(54) SEMICONDUCTOR DEVICE

(75) Inventors: Tadashi Yamaguchi, Tokyo (JP); Koyu Asai, Tokyo (JP); Mahito Sawada, Tokyo (JP); Kiyoteru Kobayashi, Tokyo (JP); Tatsunori Murata, Tokyo (JP); Satoshi Shimizu, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/977,573

(22) Filed: Dec. 23, 2010

(65) Prior Publication Data

US 2011/0092037 A1   Apr. 21, 2011

Related U.S. Application Data

(60) Continuation of application No. 12/234,079, filed on Sep. 19, 2008, now Pat. No. 7,875,539, which is a division of application No. 11/254,725, filed on Oct. 21, 2005, now abandoned.

(30) Foreign Application Priority Data

Oct. 28, 2004 (JP) ................................. 2004-313358
Aug. 30, 2005 (JP) ................................. 2005-249333

(51) Int. Cl.
*H01L 21/20* (2006.01)
(52) U.S. Cl. .. 438/584; 438/589; 438/624; 257/E21.523
(58) Field of Classification Search .................. 438/128, 438/197, 199, 584, 598, 618–627; 257/E21.523
See application file for complete search history.

(56) References Cited

U.S. PATENT DOCUMENTS

| 5,575,886 | A | 11/1996 | Murase |
| 6,100,137 | A * | 8/2000 | Chen et al. ..................... 438/253 |
| 6,437,424 | B1 | 8/2002 | Noma et al. |
| 6,649,514 | B1 | 11/2003 | Jiang et al. |
| 6,670,710 | B2 | 12/2003 | Matsunaga |

(Continued)

FOREIGN PATENT DOCUMENTS

JP   09-129625   5/1997

(Continued)

OTHER PUBLICATIONS

N. Shimoyama et al., "Enhanced Hot-Carrier Degradation due to Water in TEOS/O$_3$ Oxide and a New Method of Water Blocking using ECR-SiO$_2$ Film", SDM 92-93, pp. 51-56.

(Continued)

*Primary Examiner* — Brook Kebede
(74) *Attorney, Agent, or Firm* — McDermott Will & Emery LLP (57) ABSTRACT

In order to block hydrogen ions produced when forming an interlayer insulating film by HDP-CVD or the like to thereby suppress an adverse effect of the hydrogen ions on a device, in a semiconductor device including a contact layer, a metal interconnection and an interlayer insulating film on a semiconductor substrate having a gate electrode formed thereon, the interlayer insulating film is formed on the metal interconnection by bias-applied plasma CVD using source gas containing hydrogen atoms, and a silicon oxynitride film is provided in the underlayer of the metal interconnection and the interlayer insulating film.

20 Claims, 5 Drawing Sheets

U.S. PATENT DOCUMENTS 7,875,539 B2 * 1/2011 Yamaguchi et al. .......... 438/584
2002/0024117 A1 2/2002 Russell et al.

FOREIGN PATENT DOCUMENTS

JP 09-289209 11/1997
KR 10-0221347 B 9/1999

OTHER PUBLICATIONS

Kimiaki Shimokawa et al., "Water Desorption Control of Interlayer Dielectrics to Reduce MOSFET Hot Carrier Degradation", IEICE Trans. Electron., vol. E77-C, No. 3, Mar. 1994, pp. 473-479.

Peter Lee et al., "Moisture Trapping and Pinhole Suppression by the Use of High Refractive Index PECVD $SIO_2$ Thin Film", VMIC Conference, Jun. 7-8, 1994, ISMIC-103/94/0299, pp. 299-301.

B S Sahu, O P Agnihotri, S C Jain, R Mertens and Isamo Kato, Influence of Hydrogen on Lossess in Silicon Oxynitride Planar Optical, Semicond. Sci. and Technol. 15 (2000) L11-L14, Printed in the UK.

Korean Office Action, w/ English translation thereof, issued in Korean Patent Application No. 10-2005-0102452, dated Sep. 30, 2011.

* cited by examiner

SEMICONDUCTOR DEVICE

RELATED APPLICATIONS

This application is a Continuation of U.S. application Ser. No. 12/234,079, filed on Sep. 19, 2008, now U.S. Pat. No. 7,875,539, which is a Divisional of U.S. application Ser. No. 11/254,725, filed Oct. 21, 2005, which is now abandoned, and claims the benefit of Japanese Application Nos. 2004-313358, filed on Oct. 28, 2004, and 2005-249333, filed on Aug. 30, 2005, the disclosures of which Applications are incorporated by reference herein.

BACKGROUND OF THE INVENTION

1. Field of the Invention

The present invention relates to semiconductor devices, and more particularly to a semiconductor device having a hydrogen trapping function by insertion of a silicon oxynitride film.

2. Description of the Background Art

Multilevel interconnection configuration has increasingly been employed to achieve higher integration and higher performance of devices. To fabricate a semiconductor device having multilevel interconnections, for example, a lower-layer aluminum interconnection is formed firstly, and a silicon oxynitride film serving as an interlayer insulating film is formed on the lower-layer aluminum interconnection by CVD (Chemical Vapor Deposition) or SOG (Spin On Glass), and then an upper-layer aluminum interconnection is formed on the silicon oxynitride film.

Such multilevel interconnection configuration leads to an increase in complexity as well as a higher aspect ratio of the uneven surface portion of the element, which may cause a break of wire. Thus, for the purposes of increasing the yield of the interconnections and improving reliability, planarization and smoothing are important. Currently, a TEOS (Tetra Ethoxy Silane)/$O_3$ oxide film, a SOG film or the like has been used for such planarization and smoothing.

The silicon oxide film formed by CVD or SOG, however, contains a large amount of water ($H_2O$ or OH), which causes degradation in reliability of the device, particularly, degradation of hot-carrier resistance of a MOSFET (Metal-Oxide Semiconductor Field-Effect Transistor). To suppress such degradation due to the water from the TEOS/$O_3$ film, it has been reported that an ECR (Electron Cyclotron Resonance)-$SiO_2$ film may be deposited under the TEOS/$O_3$ film, in which case a great number of dangling bonds present iii the ECR-$SiO_2$ film can capture water from the TEOS/$O_3$ oxide film to prevent penetration of the water to the device (see N. Shimoyama et al., "Enhanced Hot-Carrier Degradation due to Water in TEOS/$O_3$ Oxide and a New Method of Water Blocking using ECR-$SiO_2$ Film", SDM 92-33, pp. 51-56).

Further, there is another way of addressing this problem of water by depositing an oxide film on a first interconnection by plasma CVD, to block water desorbing from an insulating film provided in its upper layer. It has been reported that a $SiO_2$ film formed by plasma CVD using $SiH_4$ and $N_2O$ gases under a low pressure of 1.5 Torr, and a TEOS film formed by plasma CVD by lowering the flow rate of TEOS/$O_3$, can block water and suppress MOSFET hot-carrier degradation (see Kimiaki Shimokawa et al., "Water Desorption Control of Interlayer Dielectrics to Reduce MOSFET Hot Carrier Degradation", MICE TRANS. ELECTRON., VOL. E77-C, NO. 3, MARCH 1994, pp. 473-479).

Meanwhile, it is known that a Si-rich and N-rich plasma CVD film can block water from an interlayer insulating film such as a SOG film. This film can readily be formed with $SiH_4$ and $N_2O$ gases by adding $N_2$ gas under a low pressure, and has a function of absorbing water and releasing hydrogen (see Peter Lee et al., "MOISTURE TRAPPING AND PINHOLE SUPPRESSION BY THE USE OF HIGH REFRACTIVE INDEX PECVD $SiO_2$ THIN FILM", VMIC Conference, Jun. 7-8, 1994, ISMIC-103/94/0299, pp. 299-301).

Further, it has been reported that, in a semiconductor device having an insulating film formed by CVD using a source gas having Si—H bonds, moisture resistance is improved by setting the amount of the Si—H bonds in the insulating film to $0.6 \times 10^{21}$ cm$^{-3}$ or less and by setting N concentration to $3 \times 10^{21}$ cm$^{-3}$ or more, and thus, after completion of the semiconductor device, water is prevented from reaching a metal interconnection such as aluminum, resulting in improved reliability of the semiconductor device. The insulating film is formed on the interconnection, or is used as a passivation film (see Japanese Patent Laying-Open No. 09-289209). Still further, a semiconductor device having a Si-rich oxide film, a Si oxide film, a SOG film and an oxide film formed sequentially on a lower-layer metal interconnection is known. The Si-rich oxide film, serving as an interlayer insulating film, is formed on the metal interconnection, or is used as a passivation film. It is reported that this semiconductor device ensures hot carrier reliability and good performance characteristic of the semiconductor element (see Japanese Patent Laying-Open No. 09-129625).

SUMMARY OF THE INVENTION

A silicon oxide film formed by CVD or SOG contains a great amount of water, which causes degradation of reliability of the device. One way to solve this problem of water is to form a P—SiO film serving as an interlayer insulating film by plasma CVD using TEOS, $SiH_4$, $O_2$, $N_2O$, Ar or the like as source gas. Further, there is another method of forming a P—SiO film by CCP (Capacitively Coupled Plasma) CVD using $SiH_4$, $N_2O$ or the like as source gas. With these methods, the water that desorbs from the interlayer insulating film formed by CVD or SOG and tries to penetrate into the underlayer can be blocked with the P—SiO film. With advancement in miniaturization of devices in recent years, however, the above-described CVD or SOG has been replaced with BDP (High Density Plasma) CVD so as to fill in the gaps between the fine-pitch aluminum interconnections, having a ratio H/W of the height H of the interconnection to the distance W between the neighboring interconnections to be 1.0 or greater, with an insulating film. In HDP-CVD, RF (radio frequency) bias is applied to the substrate side to aggressively attract ions, which can significantly improve the gap-filling performance. This however causes a new problem that, in the film-forming process by the HDP-CVD, the hydrogen ions ($H^+$) dissociated from $SiH_4$ come to drift due to the RF bias, penetrate into the underlayer, to thereby degrade the device. Furthermore, the bias increases the amount of hydrogen penetrating into the underlayer oxide film, so that it is necessary to provide a film having a hydrogen trapping function in the underlayer.

An object of the present invention is to provide a semiconductor device that is free from the influence of hydrogen ions, by blocking the hydrogen ions produced when forming an interlayer insulating film by HDP-CVD or the like.

A semiconductor device according to the present invention includes a contact layer, a metal interconnection and an interlayer insulating film on a semiconductor substrate having a gate electrode formed thereon. The interlayer insulating film is formed on the metal interconnection by bias-applied plasma CVD using source gas containing hydrogen atoms. A silicon oxynitride film is provided in an underlayer of the metal interconnection and the interlayer insulating film.

Preferably, the silicon oxynitride film is formed immediately under the metal interconnection, or immediately over an etch stopper film of the gate electrode, or in the contact layer. The silicon oxynitride film may be formed by plasma CVD, using source gas containing either $N_2O$ or $O_2$, and $SiH_4$. The silicon oxynitride film having Si of 34 atomic % to 40 atomic %, O of 48 atomic % to 60 atomic %, and N of 5 atomic % to 12 atomic % may be formed.

Preferably, the silicon oxynitride film is subjected to heat treatment at a temperature of not lower than 450° C., and has N, B, P or As introduced therein. In the silicon oxynitride film, H in Si—H bonds is preferably not more than $8\times10^{21}$ atoms/$cm^3$, and more preferably not more than $1\times10^{21}$ atoms/$cm^3$, by Fourier transform infrared (FT-IR) spectroscopy. Further, the film where peak of Si—O bonds is at a wave number of not less than 1020 $cm^{-1}$ and not more than 1075 $cm^{-1}$ by FT-IR spectroscopy and no peak of Si—N bonds (wave number: 835 $cm^{-1}$) is detected by FT-IR spectroscopy is suitable.

Preferably, the silicon oxynitride film has tensile stress, and has a thickness of not less than 100 nm and not more than 600 nm. The interlayer insulating film is formed by high-density plasma CVD. A multilayer type semiconductor device may be provided by forming a plurality of layers of the metal interconnections and a plurality of layers of the interlayer insulating films. Further, the present invention is applicable generally to semiconductor devices including a tunnel insulating film, a control electrode, a floating electrode, and a first metal interconnection, wherein the first metal interconnection has a ratio HAAT of a height H of the interconnection to a distance W between the neighboring interconnections, and the ratio H/W is not less than 1.0.

According to the present invention, the hydrogen ions that dissociate when forming the interlayer insulating film on the metal interconnection can be trapped to suppress hot-carrier degradation, NBTI (Negative Bias Temperature Instability) degradation and degradation of the tunnel insulating film attributable to the hydrogen ions. Particularly, it is possible to prevent degradation of hot-carrier resistance of a MOSFET device, variation in threshold value due to degradation of the tunnel oxide film in an AND or NOR type flash memory, or an adverse effect of the hydrogen ions on a device that requires a low-temperature process of not higher than 400° C. such as an MRAM or the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
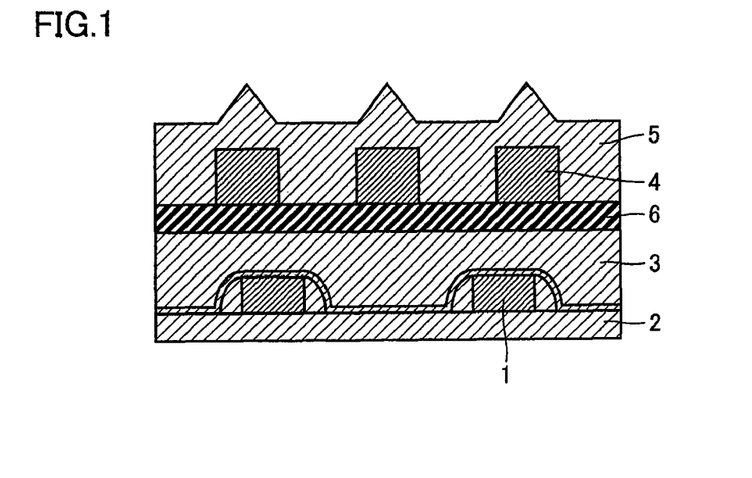
FIGS. 1-3 are conceptual diagrams showing structures of semiconductor devices of the present invention fabricated in Examples 1-3, respectively.

A typical example of the semiconductor device of the present invention is shown in FIG. 1. As shown in FIG. 1, the semiconductor device includes a contact layer 3, a metal interconnection 4 and an interlayer insulating film 5 on a semiconductor substrate 2 having a gate electrode 1 formed thereon, and is characterized in that it has a silicon oxynitride film 6 in the underlayer of metal interconnection 4 and interlayer insulating film 5. When interlayer insulating film 5 is formed on metal interconnection 4 by bias-applied plasma CVD using a source gas including hydrogen atoms such as $SiH_4$ or the like, the hydrogen ions would drift in the film-forming process due to the bias, and would penetrate into the underlayer. In the present invention, however, the silicon oxynitride film having the effect of trapping the hydrogen ions is provided in the underlayer of metal interconnection 4 and interlayer insulating film 5, so that it is possible to prevent occurrence of degradation of the device due to the hydrogen ions. Further, even in a multilayer semiconductor device having a plurality of metal interconnections and a plurality of interlayer insulating films formed therein, the silicon oxynitride film can effectively trap the hydrogen ions, whereby reliability of the device is improved.

With miniaturization of devices, HDP-CVD has been used for filling in the gaps between the metal interconnections of a finer pitch after the 90-nm node. In the film-forming process by BDP-CVD, RF bias is applied to the substrate side, so that a great amount of hydrogen ions dissociated from $SiH_4$ would penetrate into the underlayer. According to the present invention, however, even when forming an interlayer insulating film by HDP-CVD, the hydrogen ions can effectively be trapped to prevent their penetration into the gate insulating film. Accordingly, it is possible to suppress hot-carrier degradation, NBTI degradation, as well as degradation of the tunnel insulating film.

Although the present invention is generally effective for semiconductor devices, it is also particularly effective for a flash memory device of NOR type, AND type or the like, in which it is necessary to form an interlayer insulating film by HDP-CVD so as to fill in the gaps between the fine-pitch aluminum interconnections. Further, in a product to which a low-temperature process of 400° C. or lower is applied as in the case of a MRAM (Magnetic RAM), a PRAM (Phase Change RAM), or a semiconductor device incorporating both of them, for example, not only the amount of hydrogen contained in the interlayer insulating films is increased by HDP-CVD, but also the amount of hydrogen contained in other interlayer films increases. The present invention is effective particularly in such a case.

Figure 6A:
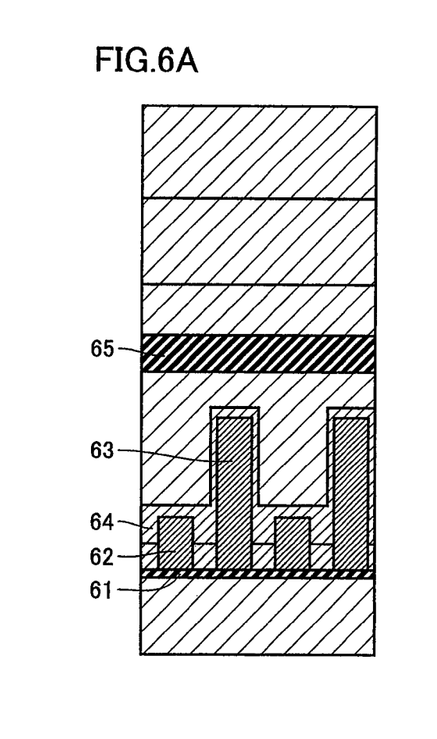
FIGS. 6A, 6B and 6C are conceptual diagrams showing structures of a memory portion, a selected transistor portion and a peripheral circuit, respectively, of an AND-type flash memory device according to the present invention.
Figure 6B:
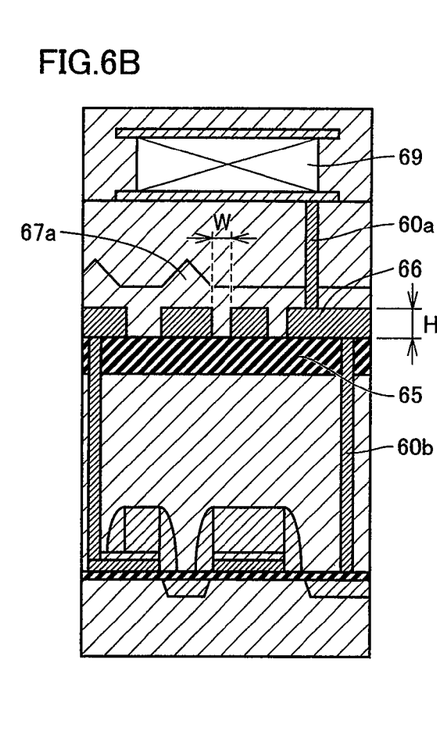
Figure 6C:
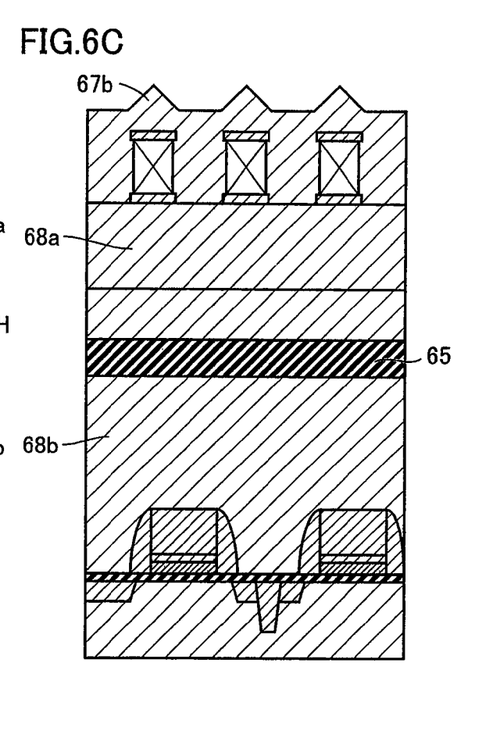

FIGS. 6A-6C show an example where the present invention is applied to an AND-type flash memory device. FIG. 6A shows a memory portion, FIG. 6B shows a selected transistor portion, and FIG. 6C shows a peripheral circuit. As shown in FIG. 6A, the memory portion is configured with a tunnel insulating film 61, a control electrode 64 and a floating electrode 63, and also has an assist electrode 62 and a silicon oxynitride film 65. As shown in FIG. 6B, the selected transistor portion has a first metal interconnection 66 made of W and a second metal interconnection 69 made of Al.

Metal interconnections 66 and 69 are connected via a contact via 60a. Metal interconnection 66 and an interconnection in the lower layer are connected via another contact via 60b. Further, an interlayer insulating film 67a is formed on first metal interconnection 66 by bias-applied plasma CVD, using source gas containing hydrogen gas. A silicon oxynitride film 65 is formed immediately beneath first metal interconnection 66. The present invention is effective even for the semiconductor device where the interlayer insulating film needs to be formed by HDP-CVD so as to fill in the gaps between the fine-pitch interconnections where the ratio H/W of the height H of first metal interconnection 66 to the distance W between the neighboring interconnections is 1.0 or greater, as shown in FIG. 6B. FIG. 6C shows, by way of example, a peripheral circuit that includes a silicon oxynitride film 65 on a contact layer (TEOS film) 68b, and has an interlayer insulating film (HDP-CVD film) 67b formed on an interlayer insulating film (p-TEOS film) 68a.

The silicon oxynitride film is provided in the underlayer of the interlayer insulating film, so as to trap the hydrogen ions dissociated from the interlayer insulating film that would otherwise penetrate into the underlayer. The silicon oxynitride film may be formed below the interlayer insulating film and above the metal interconnection to trap the hydrogen ions from the interlayer insulating film. With this configuration, however, void will occur in the silicon oxynitride film with normal CVD when the interconnection pitch becomes smaller, so that it is not possible to address the finer-pitch interconnections. Thus, in the semiconductor device of the present invention, the silicon oxynitride film is formed in the underlayer of the interlayer insulating film and the metal interconnection.

Figure 2:
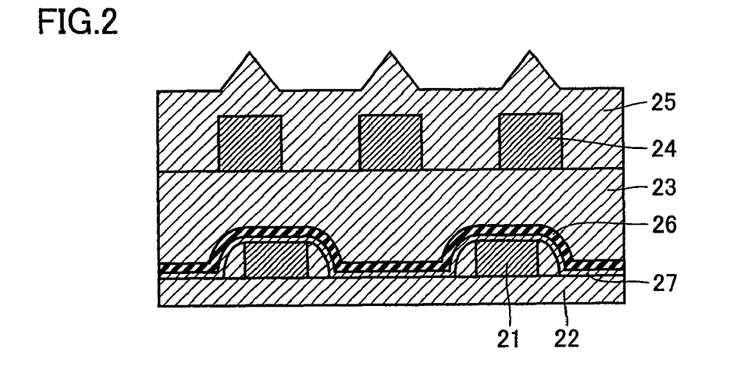
Figure 3:
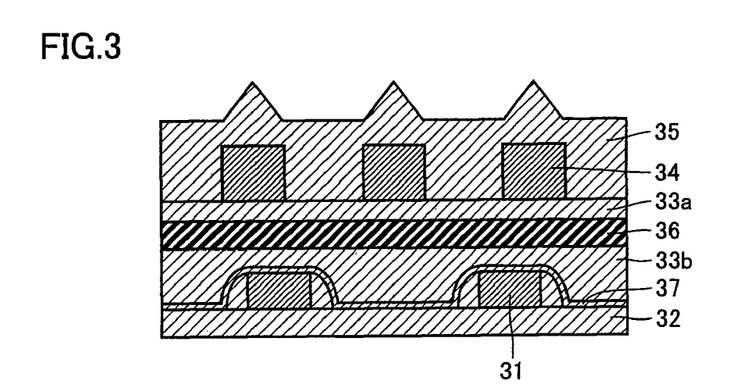

More specifically, as shown in FIG. 1, the silicon oxynitride film 6 is formed immediately beneath metal interconnection 4. Alternatively, as shown in FIG. 2, the silicon oxynitride film 26 is formed immediately above an etch stopper film 27 of a gate electrode 21. Still alternatively, as shown in FIG. 3, the silicon oxynitride film 36 is formed within contact layers 33a, 33b. Although the similar effect of trapping hydrogen ions can be enjoyed in any of these cases, the configuration to form the silicon oxynitride film immediately beneath the metal interconnection is preferable in that etching when forming a contact hole for an electrode in the contact layer becomes easy.

Figure 7A:
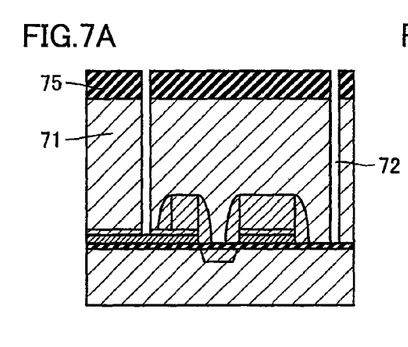
FIG. 7A is a conceptual diagram showing the state where a contact hole for an electrode is formed in a silicon oxynitride film and a contact layer in the case where the silicon oxynitride film is formed immediately beneath a metal interconnection.
Figure 7B:
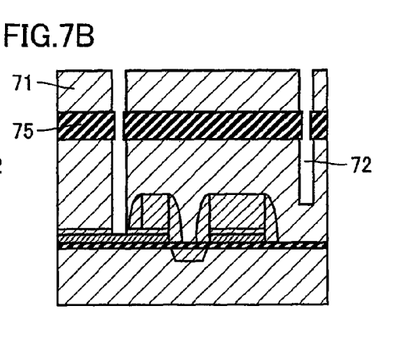
FIG. 7B is a conceptual diagram showing the state where a contact hole for an electrode is formed in a silicon oxynitride film and a contact layer in the case where the silicon oxynitride film is formed in the contact layer.

FIGS. 7A and 7B each show the state after formation of a contact hole 72 for an electrode through silicon oxynitride film 75 and contact layer 71. FIG. 7A shows the case where silicon oxynitride film 75 has been formed immediately above the contact layer 71 so as to form silicon oxynitride film 75 immediately beneath the metal interconnection. FIG. 7B shows the case where silicon oxynitride film 75 has been formed in contact layer 71. When silicon oxynitride film 75 is formed immediately above contact layer 71, as shown in FIG. 7A, contact hole 72 is formed as follows. Firstly, silicon oxynitride film 75 is etched to create an opening (first step), and next, contact layer 71 formed of an oxide film such as TEOS or the like is etched to create an opening (second step). Since silicon oxynitride film 75 and contact layer 71 differ in etching rate from each other, they are etched in separate steps as described above. Meanwhile, in the case where silicon oxynitride film 75 is formed within contact layer 71, as shown in FIG. 7B, it is necessary to form the contact hole by switching between three steps of: etching of the contact layer (oxide film such as TEOS or the like), etching of the silicon oxynitride film, and etching of the contact layer. This will complicate the etching process, in which case failure in opening of the contact hole as shown in FIG. 7B is likely to occur. Thus, it is preferable to form silicon oxynitride film 75 immediately above contact layer 71, as shown in FIG. 7A.

Figure 8A:
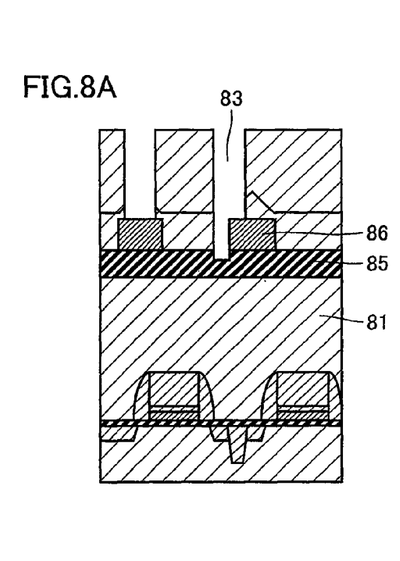
FIG. 8A is a conceptual diagram showing the state where a silicon oxynitride film is formed immediately beneath a first metal interconnection and etching is conducted to form a contact via for connecting the first metal interconnection with a second metal interconnection.
Figure 8B:
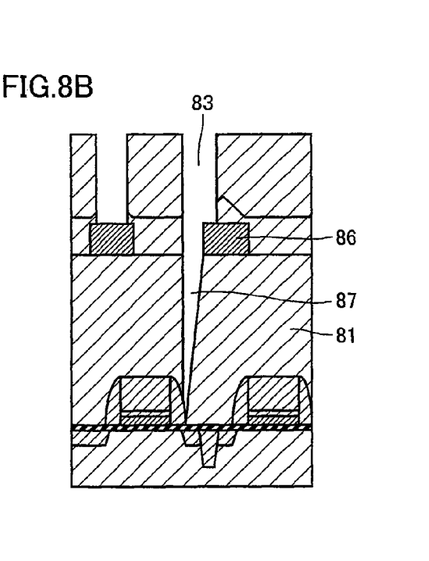
FIG. 8B is a conceptual diagram showing the state where etching is conducted to form a contact via for connecting first and second metal interconnections, without forming a silicon oxynitride film immediately beneath the first metal interconnection.

FIGS. 8A and 8B each show the state where etching has been conducted to form a contact via for connecting first and second metal interconnections. With miniaturization of devices, misalignment of the via 83 with respect to the first metal interconnection 86 becomes inevitable, as shown in FIG. 8B, in which case a slit-like opening 87 will be generated at the misaligned portion to extend through the underlying contact layer 81, which would cause a short circuit when forming a W plug afterwards. However, when the silicon oxynitride film 85 is inserted immediately beneath first interconnection 86, as shown in FIG. 8A, silicon oxynitride film 85 serves as an etch stopper film even in the event of misalignment of via 83, since the etching rate of silicon oxynitride film 85 is slower than those of the other oxide films. This can prevent formation of an opening through contact layer 81.

One conceivable way of fabricating the device will be to form a contact layer and an electrode therethrough, then form a SV (Stacked Via) layer made of a TEOS layer and a silicon oxynitride film or the like, bury an electrode in the SV layer and join it with the electrode in the contact layer, and then form a metal interconnection thereon.

With this method, however, formation of the electrode in the SV layer in alignment with the electrode in the contact layer is difficult, and the number of manufacturing steps increases. Thus, it is preferable to fabricate the device by forming a contact layer and a silicon oxynitride film, forming a contact hole and an electrode, and then forming a metal interconnection thereon. This facilitates fabrication of the device and reduces the production cost as well.

The silicon oxynitride film is made of a composition of SiON. If the amount of Si increases, the percentage of Si in the non-bonded state within the silicon oxynitride film increases, which is preferable in that the hydrogen ion trapping function is enhanced. From this standpoint, the silicon oxynitride film of the present invention preferably has a composition where Si is from 34 atomic % to 40 atomic %, 0 is from 48 atomic % to 60 atomic %, and N is from 5 atomic % to 12 atomic %. The silicon oxynitride film having such a composition may be formed by plasma CVD, using source gas containing either $N_2O$ or $O_2$, and $SiH_4$.

When the silicon oxynitride film is formed by plasma CVD using source gas containing $SiH_4$, Si—H bonds are produced. H in the Si—H bonds is preferably not more than $8\times10^{21}$ atoms/cm$^3$, more preferably not more than $4\times10^{21}$ atoms/cm$^3$, and most preferably not more than $1\times10^{21}$ atoms/cm$^3$, by FT-IR spectroscopy, from the standpoint of enhancement of the hydrogen ion trapping function. The hydrogen ion trapping sites for trapping the hydrogen ions may be increased by subjecting the silicon oxynitride film having been formed to heat treatment. This can suppress release of the once trapped hydrogen ions and can significantly improve the hydrogen ion trapping function. The heating temperature is preferably not lower than 450° C., more preferably not lower than 600° C., and most preferably not lower than 700° C.

The hydrogen ion trapping sites may also be increased by introducing ions of N, B, P or As into the silicon oxynitride film, or by providing the silicon oxynitride film with tensile stress. Furthermore, the hydrogen ion trapping sites may be increased by increasing the density of dangling bonds, or by X-ray irradiation or UV irradiation. With these methods, a silicon oxynitride film where H in the Si—H bonds is not more than $1 \times 10^{21}$ atoms/cm$^3$ by FT-IR spectroscopy can be obtained. Further, it is possible to form a silicon oxynitride film in which peak of the Si—O bonds by FT-IR spectroscopy is at the wave number of not less than 1020 cm$^{-1}$ and not more than 1075 cm$^{-1}$, and peak of the Si—N bonds (wave number: 835 cm$^{-1}$) is not detected. Such a silicon oxynitride film is preferable in that its hydrogen ion trapping capability is great.

Figure 4A:
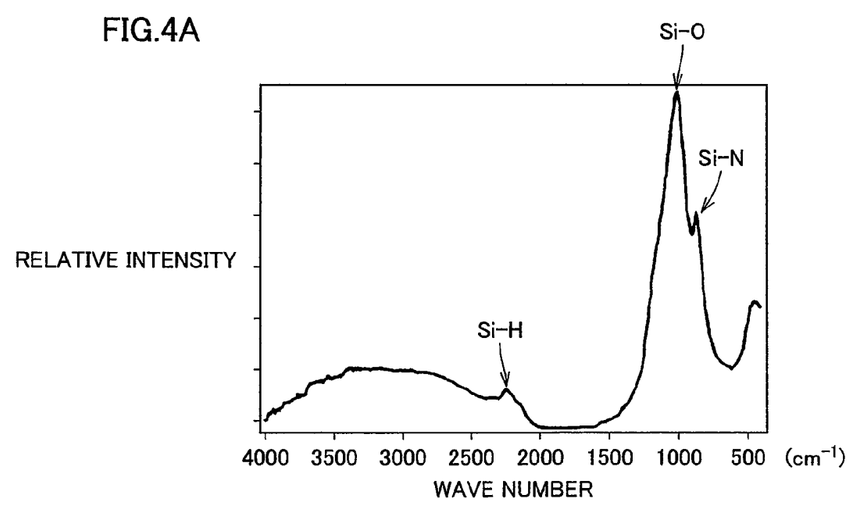
FIGS. 4A and 4B show data of an untreated silicon oxynitride film and a silicon oxynitride film heat-treated at about 800° C., respectively, obtained by FT-IR (Fourier Transform InfraRed) spectroscopy.
Figure 4B:
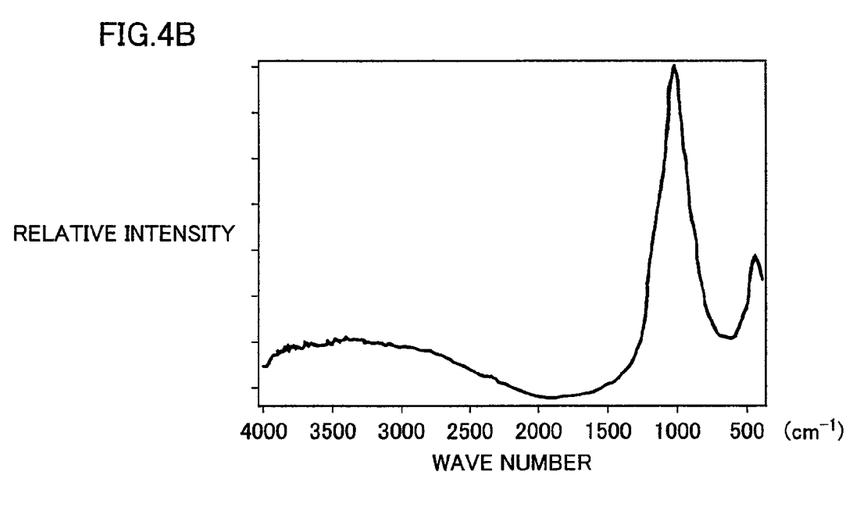

FIGS. 4A and 4B each show data of a silicon oxynitride film by FT-IR spectroscopy. FIG. 4A shows FT-IR data of an untreated film, and FIG. 4B shows data of the silicon oxynitride film having undergone heat treatment at about 800° C. In the silicon oxynitride film heat-treated at about 800° C., H in the Si—H bonds is $0.8 \times 10^{21}$ atoms/cm$^3$ by FT-IR spectroscopy, and peak of the Si—O bonds by FT-IR spectroscopy is at the waver number of not less than 1020 cm$^{-1}$ and not more than 1075 cm$^{-1}$, and peak of the Si—N bonds (wave number: 835 cm$^{-1}$) is not detected.

The preferable thickness of the silicon oxynitride film varies depending on its chemical composition or the like. However, in general, it is preferably not less than 100 nm and more preferably not less than 250 nm, from the standpoint of ensuring sufficient hydrogen ion trapping function. Although the trapping function increases as the thickness of the silicon oxynitride film increases, too thick a film would suffer cracking. Thus, it is preferably not more than 600 nm and more preferably not more than 350 nm.

Example 1

Figure 5:
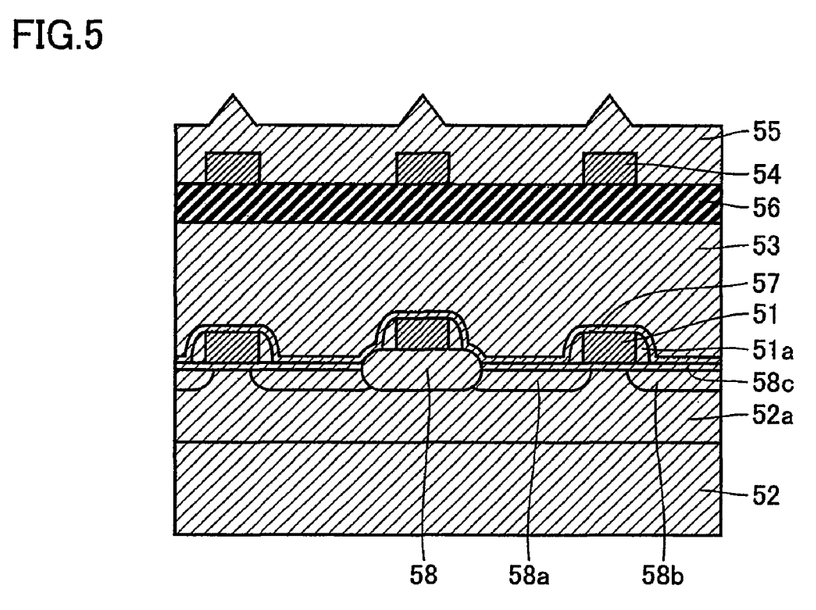
FIG. 5 is a conceptual diagram showing the structure of the semiconductor device of the present invention fabricated in Example 1.

FIGS. 1 and 5 show a structure of a semiconductor device fabricated in the present example. FIG. 1 shows only the basic elements from among the constituent elements shown in FIG. 5, for better understanding of the present invention as well as for facilitating comparison with the semiconductor devices shown in FIGS. 2 and 3.

As shown in FIG. 5, firstly, a p-type well 52a was formed on a semiconductor substrate 52, and a field oxide film 58 was formed on a surface of p-type well 52a. Next, a gate oxide film 58c was formed on p-type well 52a, and a gate electrode 51 was formed on gate oxide film 58c. A sidewall spacer 51a was formed on the side surface of gate electrode 51.

A SiN film serving as an etch stopper film 57 was formed on gate electrode 51 and, using gate electrode 51 and sidewall spacer 51a as masks, impurity ions were implanted, to form a source region 58a and a drain region 58b on the respective sides of gate electrode 51. Thereafter, a TEOS film was formed as a contact layer 53, and a silicon oxynitride film 56 was formed on contact layer 53.

Silicon oxynitride film 56 was formed by plasma CVD, using SiR$_4$ (flow rate: 100 cm$^3$/min) and N$_2$O (flow rate: 1 L/min) as source gas. Thereafter, it was subjected to heat treatment at 450° C. under the N$_2$ atmosphere. This silicon oxynitride film had a composition of Si of 37 atomic %, O of 55 atomic % and N of 9 atomic %, and H in the Si—H bonds was $6 \times 10^{21}$ atoms/cm$^3$ by FT-lit spectroscopy. The film thickness was 250 nm.

Next, a metal interconnection 54 of Al was formed on silicon oxynitride film 56, and an interlayer insulating film 55 was formed on metal interconnection 54. Interlayer insulating film 55 was formed by HDP-CVD, using SiH$_a$ (flow rate: 100 cm$^3$/min), O$_2$ (flow rate: 100 cm$^3$/min), and Ar (flow rate: 100 cm$^3$/min) as source gas. HDP-CVD was carried out at 1 kW, by applying RF bias of 13.56 MHz.

When interlayer insulating film 55 is formed by HDP-CVD, the hydrogen ions dissociated from SiH$_4$ during the forming process come to drift due to the RF bias and penetrate into the underlayer. According to SIMS (Secondary Ion Mass Spectroscopy), the hydrogen ions penetrating into the underlayer was $1 \times 10^{21}$ atoms/cm$^3$ or more. In the present example, however, the silicon oxynitride film was formed immediately beneath the metal interconnection, and no hydrogen ion penetrating into the underlayer was observed.

Example 2

In Example 1, silicon oxynitride film 6 was formed immediately beneath metal interconnection 4, as shown in FIG. 1. In the present example, a silicon oxynitride film 26 was formed immediately above an etch stopper film 27 of a gate electrode 21, as shown in FIG. 2. That is, in the present example, an etch stopper film 27, a silicon oxynitride film 26, a contact layer 23, a metal interconnection 24, and an interlayer insulating film 25 were formed on a semiconductor substrate 22 having a gate electrode 21 formed thereon. The semiconductor device was fabricated in the similar manner as in Example 1, except that the order of forming the layers was different as described above.

In the semiconductor device thus fabricated, the silicon oxynitride film had a composition of Si of 38 atomic %, O of 53 atomic %, and N of 10 atomic %, H in the Si—H bonds by FT-IR spectroscopy was $5 \times 10^{21}$ atoms/cm$^3$, and the film thickness was 300 nm. In the present example, no hydrogen ion penetrating through the silicon oxynitride film into the underlayer was observed by SIMS.

Example 3

In Example 1, silicon oxynitride film 6 was formed immediately beneath metal interconnection 4, as shown in FIG. 1. In the present example, a silicon oxynitride film 36 was formed in contact layers 33a, 33b, as shown in FIG. 3. That is, in the present example, an etch stopper layer 37, a contact layer 33b, a silicon oxynitride film 36, a contact layer 33a, a metal interconnection 34, and an interlayer insulating film 35 were formed on a semiconductor substrate 32 having a gate electrode 31 formed thereon. Except for the difference in order of forming the layers, the semiconductor device was fabricated in the similar manner as in Example 1.

In the semiconductor device thus fabricated, the silicon oxynitride film had a composition of Si of 36 atomic %, O of 52 atomic % and N of 10 atomic %, H in the Si—H bonds by FT-IR spectroscopy was $7 \times 10^{21}$ atoms/cm$^3$, and its thickness was 280 nm. In the present example, there was no hydrogen ion observed by SIMS that penetrates through the silicon oxynitride film into the underlayer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

preparing a semiconductor substrate;
forming a plurality of first transistors and a plurality of second transistors on the semiconductor substrate;
forming a first insulating film over the semiconductor substrate and the first and second transistors;
forming a silicon oxynitride film over the first insulating film;
forming a plurality of metal wirings on the silicon oxynitride film;
forming a plurality of contact plugs in the first insulating film and the silicon oxynitride film after the forming the silicon oxynitride film before forming the plurality of metal wirings; and
forming a second insulating film formed over and between the plurality of metal wirings by bias-applied plasma CVD using source gas containing hydrogen atoms,
wherein each of the plurality of contact plugs is connected to each of the plurality of metal wirings in the step of forming the metal wirings, and
wherein each of the first transistors includes a tunnel insulating film, a control gate electrode, and a floating gate electrode, and
wherein each of the second transistors includes a gate insulating film and a gate electrode.

2. The method of manufacturing the semiconductor device according to the claim 1, wherein one of the metal wirings is electrically connected to the semiconductor substrate via one of the contact plugs, and
wherein another of the metal wirings is connected to one of the gate electrodes via another of the contact plugs.

3. The method of manufacturing the semiconductor device according to the claim 1, wherein forming the plurality of contact plugs includes the steps of:
etching the silicon oxynitride film to form a first contact hole;
etching the first insulating film as a silicon oxide film to form a second contact hole which is continuous to the first contact hole; and
forming the contact plug in the first contact hole and the second contact hole, and wherein
a bottom surface of each of the plurality of metal wirings is directly in contact to an upper surface of the silicon oxynitride film.

4. The method of manufacturing the semiconductor device according to the claim 1, wherein a memory unit includes the first transistors, and a peripheral circuit includes the second transistors.

5. The semiconductor device according to claim 1, wherein said silicon oxynitride film is formed immediately under the plurality of metal wirings.

6. The semiconductor device according to claim 1, wherein said silicon oxynitride film is formed immediately over an etch stopper film of the gate electrode.

7. The semiconductor device according to claim 1, wherein said silicon oxynitride film is formed between the first insulating film and a third insulating film, and
wherein the third insulating film is formed between the silicon oxynitride film and the metal wirings.

8. The semiconductor device according to claim 1, wherein said silicon oxynitride film is formed by plasma CVD.

9. The semiconductor device according to claim 8, wherein said silicon oxynitride film is formed using source gas containing either $N_2O$ or $O_2$, and $SiH_4$.

10. The semiconductor device according to claim 9, wherein said silicon oxynitride film has Si of 34 atomic % to 40 atomic %, O of 48 atomic % to 60 atomic %, and N of 5 atomic % to 12 atomic %.

11. The semiconductor device according to claim 1, wherein said silicon oxynitride film is subjected to heat treatment at a temperature of not lower than 450° C.

12. The semiconductor device according to claim 1, wherein said silicon oxynitride film has H in Si—H bonds of not more than $8 \times 10^{21}$ atoms/cm$^3$ by Fourier transform infrared (FT-IR) spectroscopy.

13. The semiconductor device according to claim 1, wherein said silicon oxynitride film has N, B, P or As introduced therein.

14. The semiconductor device according to claim 1, wherein in said silicon oxynitride film, H in Si—H bonds is not more than $1 \times 10^{21}$ atoms/cm$^3$ by FT-IR spectroscopy, peak of Si—O bonds is at a wave number of not less than 1020 cm$^{-1}$ and not more than 1075 cm$^{-1}$ by FT-IR spectroscopy, and no peak of Si—N bonds (wave number: 835 cm$^{-1}$) is detected by FT-IR spectroscopy.

15. The semiconductor device according to claim 14, wherein said silicon oxynitride film has tensile stress.

16. The semiconductor device according to claim 1, wherein said silicon oxynitride film has a thickness of not less than 100 nm and not more than 600 nm.

17. The semiconductor device according to claim 1, wherein said second insulating film is formed by high-density plasma CVD.

18. The semiconductor device according to claim 1, wherein a plurality of layers of said metal wirings and a plurality of layers of said second insulating film are formed.

19. The semiconductor device according to claim 1, including a first metal interconnection,
wherein the first metal interconnection has a ratio H/W of a height H of the interconnection to a distance W between the neighboring interconnections, and the ratio H/W is not less than 1.0.

20. The semiconductor device according to claim 1, wherein the metal wiring has a ratio H/W of a height H of the interconnection to a distance W between the neighboring interconnections, and the ratio H/W is not less than 1.0.

* * * * *